US006666207B1

United States Patent
Arkas et al.

(10) Patent No.: US 6,666,207 B1
(45) Date of Patent: Dec. 23, 2003

(54) SOLAR ENERGY CONCENTRATOR AND CONVERTER

(75) Inventors: Evangelos Arkas, London (GB); Nicholas Arkas, London (GB)

(73) Assignee: Prometheus Technology, Inc., Tortola (VG)

( * ) Notice: Subject to any disclaimer, the term of this patent is extended or adjusted under 35 U.S.C. 154(b) by 0 days.

(21) Appl. No.: 09/830,764

(22) PCT Filed: Nov. 11, 1999

(86) PCT No.: PCT/GB99/03757

§ 371 (c)(1),
(2), (4) Date: Aug. 6, 2001

(87) PCT Pub. No.: WO00/28264

PCT Pub. Date: May 18, 2000

(30) Foreign Application Priority Data

Nov. 11, 1998 (GB) ............................................. 9824771

(51) Int. Cl.[7] ................................................... F24J 2/10
(52) U.S. Cl. ..................... 126/685; 136/246; 359/598; 359/861
(58) Field of Search ................................ 126/684, 685; 359/598, 851, 858, 861; 136/246; 362/576; 385/900

(56) References Cited

U.S. PATENT DOCUMENTS

| 3,974,824 A | 8/1976 | Smith |
| 3,986,490 A | 10/1976 | Chao et al. |
| 3,991,740 A | * 11/1976 | Rabl ............................ 136/246 |
| 4,088,121 A | 5/1978 | Lapeyre |
| 4,147,415 A | 4/1979 | Dolan |
| 4,148,299 A | * 4/1979 | Sherman, Jr. ................ 126/685 |
| 4,236,383 A | 12/1980 | Selcuk |
| 4,287,880 A | 9/1981 | Geppert |
| 4,312,329 A | 1/1982 | Carver |
| 4,444,176 A | * 4/1984 | Hanson ........................ 126/685 |
| 4,610,518 A | * 9/1986 | Clegg ........................... 126/685 |
| 4,947,292 A | 8/1990 | Vlah |
| 5,581,447 A | * 12/1996 | Raasakka ..................... 362/557 |

FOREIGN PATENT DOCUMENTS

| DE | 4014189 | 4/1991 |
| JP | 60-30950 A | * 2/1985 |

* cited by examiner

Primary Examiner—Sara Clarke
(74) Attorney, Agent, or Firm—Timothy J. Keefer; Wildman, Harrold, Allen & Dixon LLP

(57) ABSTRACT

A solar energy concentrator (1) is formed in the shape of a spiral horn, so that solar energy incident over a wide range of incident angles on the mouth (2) of the horn is concentrated by multiple reflections from inner walls (5) of the horn to emerge from an exit aperture (3) at the center of the horn. Solar energy emerging from the collector may be distributed by light pipes (40) to illuminate a building or may be transmitted to a solar energy conversion chamber (50) having a small entry aperture (51). The entry aperture (51) acts as black body absorbing all solar energy incident upon it and the solar energy may be converted within the chamber (50) either by photovoltaic cells and/or by heat absorbing media.

25 Claims, 5 Drawing Sheets

SOLAR ENERGY CONCENTRATOR AND CONVERTER

Figure 1:
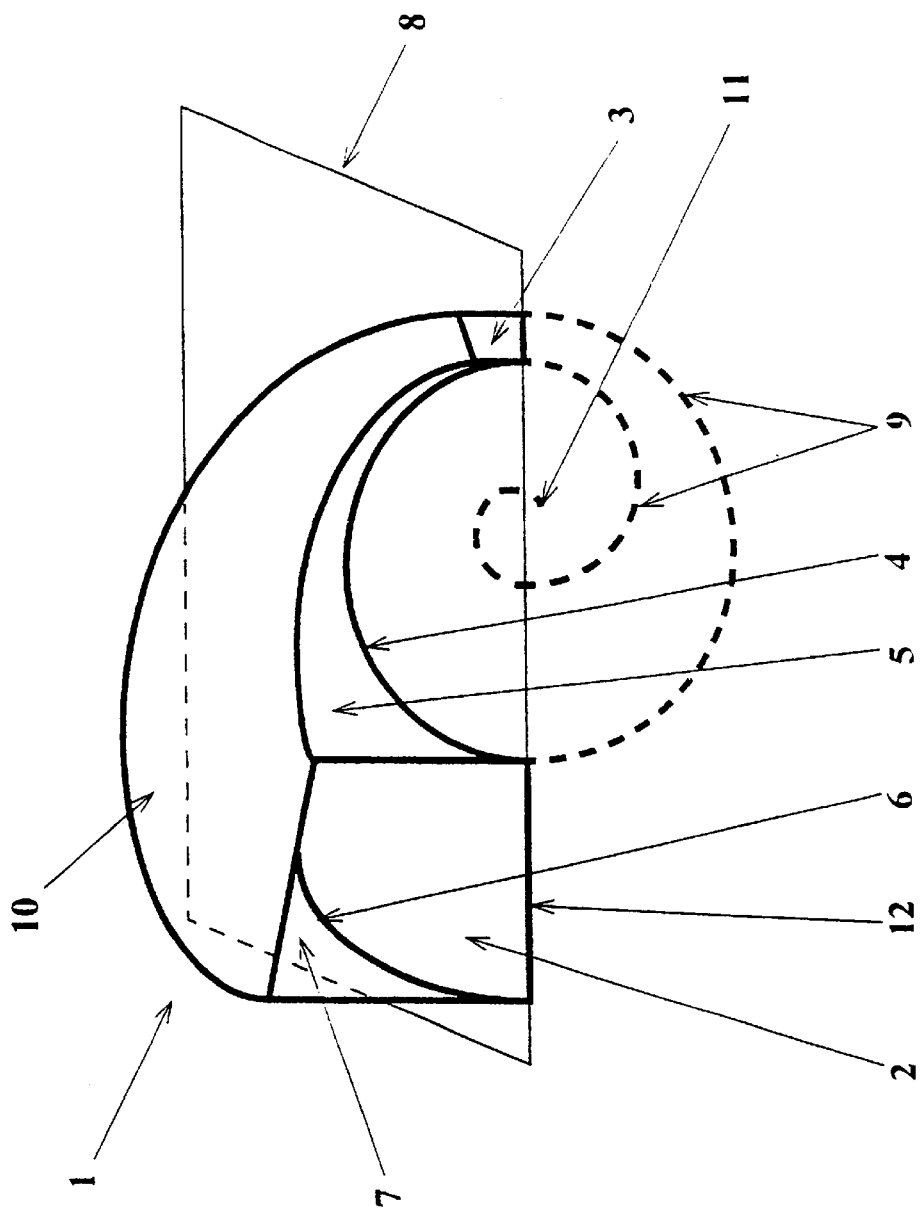

This invention relates to a solar energy concentrator, a solar energy concentrator in combination with a solar energy distributor and a solar energy concentrator in combination with a solar energy conversion chamber.

Solar energy concentrators, for use prior to converting solar energy into other useful forms of energy, are well known. Concentrated solar energy may be used in a solar furnace or converted into other forms of energy by, for example, a thermally absorbent medium, usually containing a fluid, or by a photovoltaic cell.

Known solar concentrators include parabolic dish receivers which, in order to focus direct sunlight, track the sun across the sky. These devices are usually built on towers which must be able to withstand substantial wind shear while producing a minimum of shadow on the face of the collector. The shape of the collector must remain constant over time, and tracking must be accurate to maintain an angle of incidence within one degree throughout the day. Further, when used in conjunction with a Stirling engine there are also potential problems of wind gusts creating fluctuations in the heat exchange and therefore in the power output.

Land use (8–17 acres per megawatt, 3.2–6.9 hectares/megawatt), site preparation, installation, capital costs and maintenance of heliostats in the towers are also expensive.

Solar concentrators, which use either a lens or a compound reflective surface, are also commercially available but they too require tracking mechanisms to track the sun's movement across the sky. The cost of purchase, installation, maintenance and associated land requirements are again substantial.

Various solar concentrators are also known, which do not require tracking mechanisms, however, they suffer from various limitations, e.g., the acceptance angle of some of the concentrators are so limited that the sun's rays can be received only for a small portion of the day. In others, a concentration factor may be satisfactory only during a limited time of day.

Moreover, known concentrators are designed for operation in direct sunlight, and do not function satisfactorily in diffuse or scattered light. For example, the solar collector of U.S. Pat. No. 4,287,880 (Geppert) comprises a reflector formed from three separate curves, which focus solar energy onto a pipe collector, such that rays of sunlight having different angles of incidence are reflected by different parts of the reflector onto the collector pipe to heat a fluid flowing, through the pipe. However, the device cannot effectively concentrate diffuse light and is therefore limited in its geographical application. The efficiency of the pipe absorber will also vary as a function of the ambient air temperature, because heat absorption, transfer and collection is external to the device.

An involute beam concentrator disclosed in U.S. Pat. No. 4,610,518 (Clegg) uses an involute chamber to convert a concentrated rectangular beam of sunlight emergent from a prismatic beam concentrator into a concentrated solar beam parallel to an axis of the concentrator. This concentrator is designed to accept input solar energy from the prismatic beam collector only over a very small range of incident angles.

The use of photovoltaic cells in the form of silicon solar cells also suffers from the disadvantage that the spectral distribution of sunlight has a maximum spectral radiance at a wavelength of 540 nanometres whereas the maximum sensitivity of the solar cells occurs at 813 nanometres. As a result, much of the energy falling on the solar cell is not converted into electricity. Moreover, these solar cells have to be cooled to maintain operational peak efficiency.

U.S. Pat. No. 4,947,292 (Vlah) discloses a lighting system designed to produce a diffuse light from a concentrated light source, in which a concentrated light source is located at the focus of a spiral-shaped horn and diffuse light is emitted from the mouth of the horn. A preferred shape of the spiral is a "Golden Section spiral", also known as a volute, formed from a series of nested "Golden Section" rectangles, i.e., rectangles in which the ratio of the lengths of the larger and smaller sides is $\frac{1}{2}(1+5^{1/2}):1$, which may be used to locate the "Golden Section" centres for the arcs which make up a "Golden Sections" spiral.

It is an object of this invention to provide a solar energy concentrator, a solar energy concentrator in combination with a solar energy distributor and a solar energy concentrator in combination with a solar energy conversion chamber which at least partially mitigate some of the difficulties of the prior art.

According to a first aspect of the invention there is provided a solar energy concentrator comprising a spiral horn having an axis perpendicular to a plane of the spiral, said concentrator including: an input aperture forming a mouth of the horn, an internal light-reflecting surface of the horn, and an exit aperture at an end of the horn remote from the mouth of the horn, said exit aperture being smaller than said input aperture and said horn continuously tapering both in the direction of said axis and in the plane of the spiral, between the input and output apertures, wherein the horn is adapted to concentrate, by multiple reflections from the internal light-reflecting surface of the horn, solar energy incident within a predetermined range of angles of incidence on the input aperture, such that concentrated solar energy is emitted from the exit aperture.

Preferably at least one director is provided in the mouth of the horn to reflect light incident from outside the predetermined range of angles of incidence into the predetermined range of angles of incidence.

Conveniently, the at least one director is a baffle disposed substantially parallel to the axis of the spiral horn.

Advantageously, the at least one director is a partial spiral horn disposed substantially perpendicular to the axis of the spiral horn in at least a portion of the spiral horn most proximate to the mouth of the horn.

Conveniently, the spiral horn has a substantially quadrilateral cross-section parallel to the axis of the horn.

Advantageously the taper in the plane of the spiral is a Golden Spiral.

Conveniently the horn is of metal.

Advantageously the metal is aluminium.

Preferably the horn has portions formed of different materials disposed along the horn spiral, the materials being adapted to withstand the temperatures reached in the respective portions of the collector in use.

Advantageously a portion of the horn proximate the exit aperture is of a ceramic material.

Conveniently the light-reflecting surface is protected by ultraviolet radiation absorbing means.

According to a second aspect of the invention there is provided a solar energy concentrator according to the first aspect in combination with distribution means in communication with the exit aperture and adapted for distributing the concentrated solar energy emitted from the exit aperture.

Preferably the distributions means includes at least one light pipe.

Advantageously the distribution means includes a diffuser for diffusing at least some of the concentrated solar energy to provide illumination.

Conveniently the diffuser is in the shape of a spiral horn.

According to a third aspect of the invention there is provided a solar energy concentrator according to said first aspect, in combination with a solar energy conversion chamber having a chamber aperture in communication with the concentrator exit aperture, the chamber containing energy conversion means for converting concentrated solar energy emitted from the exit aperture.

Advantageously, the energy conversion means includes a photovoltaic cell.

Conveniently the energy conversion means includes heat absorbing media.

Advantageously the energy conversion means includes steam generating means.

Conveniently, the energy conversion means includes a solar furnace.

Advantageously, at least some of the solar energy is reflected within the chamber before being incident on the energy conversion means.

Advantageously at least some of the solar energy undergoes wavelength changes within the chamber.

Conveniently, the solar energy undergoes wavelength increases by energy absorption and/or dissipation.

Conveniently, solar energy distribution means is provided to transmit solar energy from the exit aperture to the chamber aperture.

Advantageously the distribution means includes at least one light pipe.

The first aspect of the present invention has the advantage that the collector can collect solar energy over a large range of angles of incidence without the need for tracking mechanisms. The collector therefore efficiently collects and concentrates diffuse light. An advantage of the third aspect of the invention is that the chamber aperture of the solar energy conversion chamber approximates a black body so that most of the energy entering the chamber is absorbed within the chamber. The wavelength of solar energy may also be changed in the chamber to enable more of the energy to be absorbed by a photovoltaic cell and converted into electricity. In addition, any heat produced may also be utilised.

Figure 2:
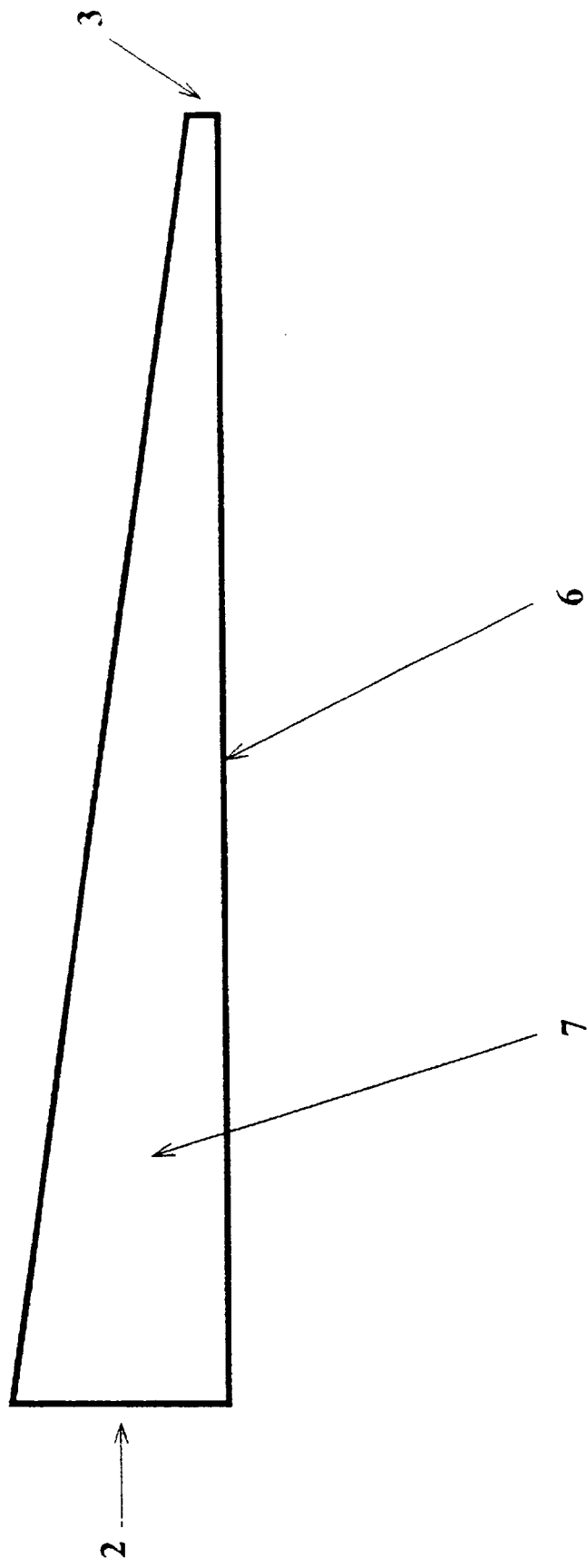
Figure 4:
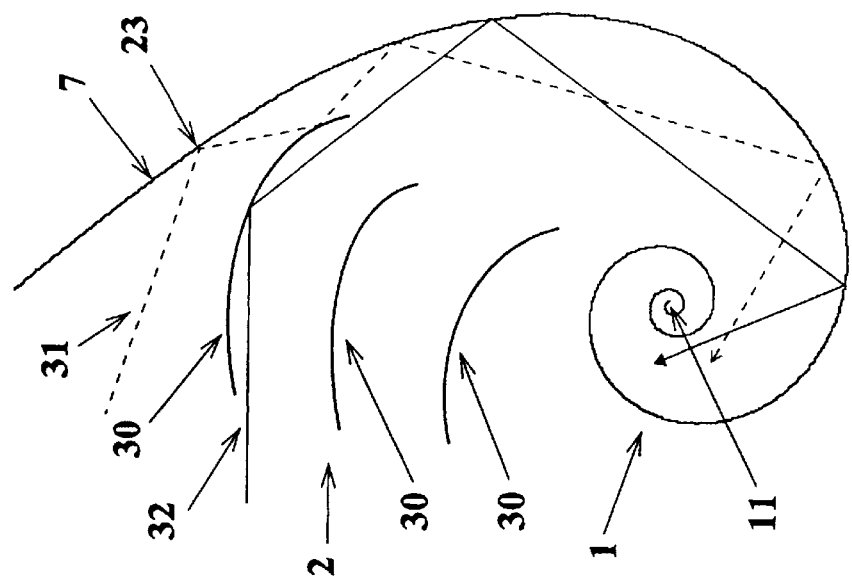
Figure 3:
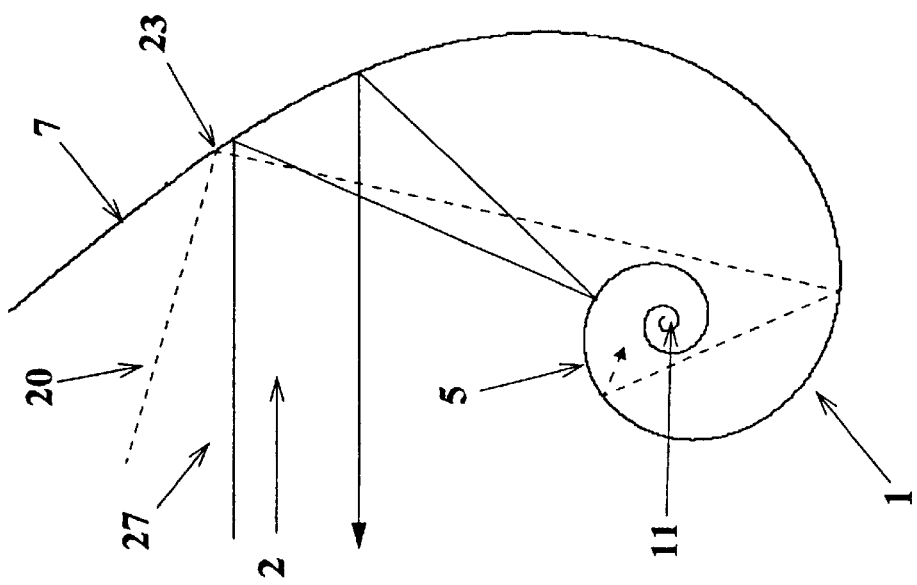
Figure 5:
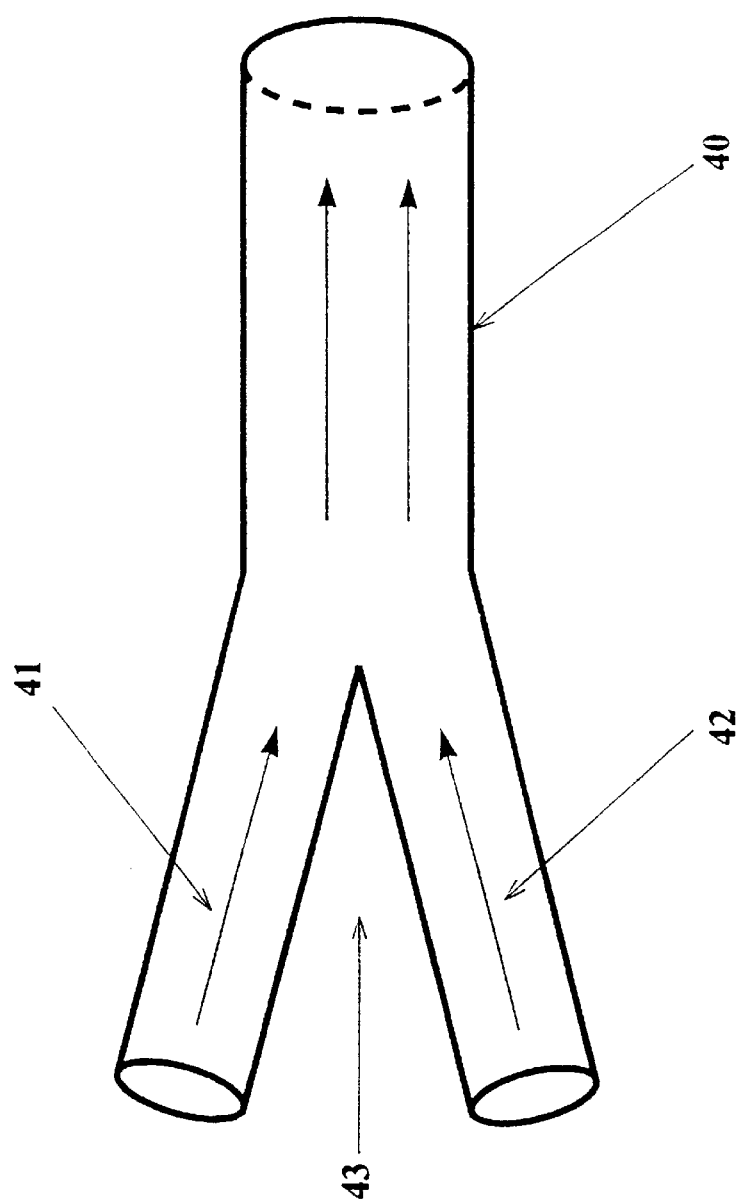
Figure 6:
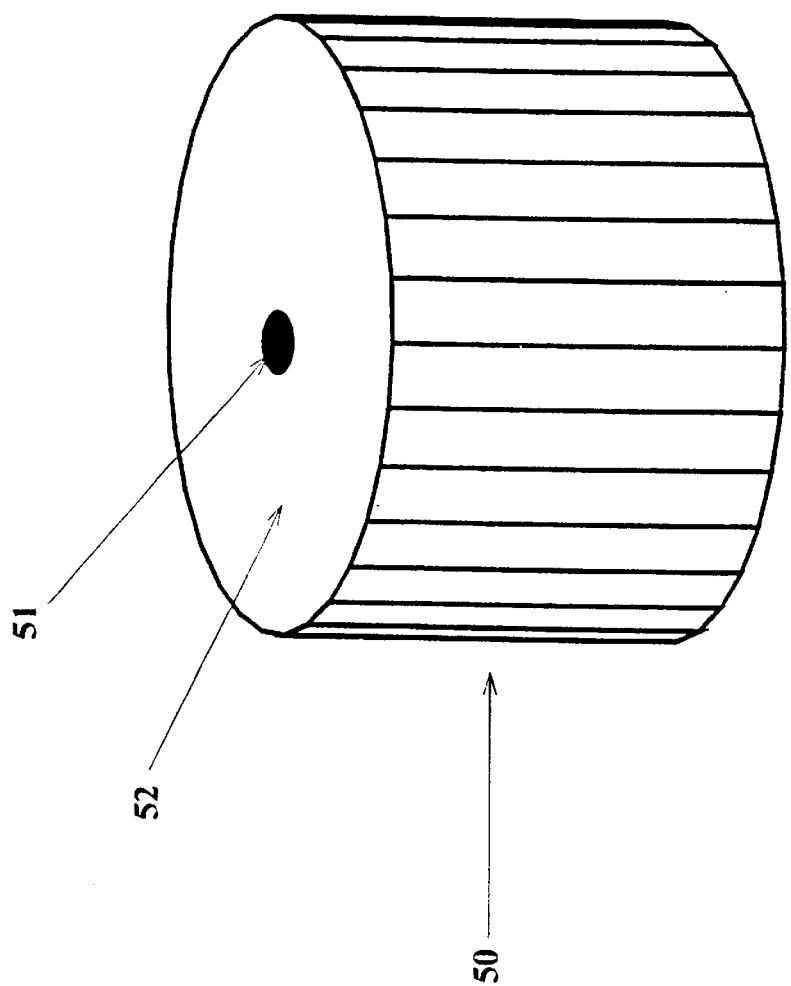

The invention will now be described by way of example with reference to the accompanying drawings, in which FIG. 1 shows a solar energy collector according the invention, FIG. 2 shows a side wall of the collector of FIG. 1 before being wound into a spiral, FIG. 3 shows a cross-section of a collector of the invention, FIG. 4 shows a cross-section of a collector of the invention having baffles in the mouth of the horn, FIG. 5 shows a light pipe used in the invention, and FIG. 6 shows a conversion chamber of the invention.

In the figures like reference numerals denote like parts.

The solar collector 1 shown in FIG. 1 is a spiral horn, having an input aperture 2 and an exit aperture 3 in a first plane. The lower edge 4 of an inner wall 5 and the lower edge 6 of an outer wall 7 define a second plane 8 perpendicular to the first plane and the inter-section of the lower edge 6 of the outer wall 7 with the second plane 8 and the inter-section of the lower edge 4 of the inner wall 5 with the second plane 8 lie on a same "Golden Section" spiral, as indicated by the projection of the inter-section of the lower edge 6 of the outer wall 7 and the inter-section of the lower edge 4 of the inner wall 5 shown by dotted lines 9 in FIG. 1. The inner wall 5 and outer wall 7 before being formed into a spiral have the shape shown in FIG. 2. The transverse cross-section of the spiral is a quadrilateral, the inner wall 5 being- shorter than the outer wall 7 such that the upper surface 10 of the horn as shown in FIG. 1 is angled in towards the centre 11 of the spiral. As best shown in the FIG. 2, the height of both the inner wall 5 and the outer wall 7 decreases from the input aperture 2 to the exit aperture 3.

FIG. 3 shows a cross-sectional view of the spiral horn of FIG. 1. The shape of the spiral may be plotted using the function rkfixed available, for example, in the computer package "Mathemitca" available from Wolfram Research Inc., PO Box 6059, Shampaign, Ill. 61821-9902, USA, or in the package "Mathcad" available from Mathsoft Inc, 101 Main Street, Cambridge, Mass. 02142 USA.

An incident ray 20 as shown by a broken line in FIG. 3, undergoes multiple reflections on the internal surface of the outer and inner walls 7,5 of the spiral horn 1 to be directed towards the centre or focus 11 of the spiral horn 1. However, a ray of light 27 incident at the same point 23 as the ray 20 on the spiral at a smaller angle of incidence undergoes multiple reflections and is reflected out of the input aperture 2 of the horn 1.

With the insertion of baffles 30 in the mouth 2 of the horn 1, as shown in FIG. 4, a ray of light 31, as shown by the broken line, incident on the same point 23 of the spiral horn as shown in FIG. 3 is reflected by the baffle 30 towards the wall 7 of the spiral horn 1 and is reflected ultimately towards the centre 11 of the spiral. In addition, a ray of light 32, which in the absence of the baffle, would be incident of the same point 23 on the spiral horn 1 at a smaller angle of incidence, as shown by the full line in FIG. 4, is incident instead on the baffle 30 and reflected thereby onto the surface of spiral horn 1 from where it is reflected towards the centre 11 of the spiral. Thus, the insertion of baffles 30 within the mouth of the horn increases the range of angles of incidence of solar energy rays which are reflected towards the centre 11 of the spiral. The baffles 30, as shown in FIG. 4, also follow the curve of a spiral, thereby forming a number of spiral horns within the mouth 2 of the horn of the collector.

Alternatively, instead of vertical baffles 30 located between a lower surface 12 and the upper surface 10 of the mouth 2 of the spiral collector, a plurality of partial spiral horns may be inserted in the mouth 2 of the spiral horn to form a honeycomb of small spiral horns within a portion of the collector closest to the input aperture.

The spiral horn 1 may be formed of polished metal, for example, aluminium. However, because of the high temperatures reached towards the portion of the spiral closest to the exit aperture 3, a portion of the spiral horn closest to the exit aperture 3 may be formed of a ceramics material. Additionally, a portion of the horn closest to the input aperture 2, which is subject to lower temperatures than the rest of the horn may be formed of a plastics material coated with metal to form a reflective surface.

The entry aperture 2 may be covered by a window to absorb ultraviolet light, to protect the reflective surfaces of the spiral horn 1 from damage from ultraviolet light, or preferably the horn may be formed of a glass-metal-glass sandwich in which the glass layers absorb ultraviolet light.

Light exiting from the exit aperture 3 may be directed by means of known light pipes 40, as shown in FIG. 5. As indicated in FIG. 5, light 41, 42 from more than one collector may be combined by a 'Y'-unction 43 of light pipes 40 for subsequent distribution.

Light exiting from the collector 1 may be used in any known method of solar energy conversion, or may be distributed by light pipes 40, to provide illumination, for example, in a building. Light may be extracted from the light pipe 40 for illumination, by means of a diffuser. The diffuser may be in a form of a spiral horn, wherein light from the light pipe 40 is incident on a small input aperture at the centre of a spiral horn and diffuse light is diffused from a large exit aperture at the mouth of the horn. That is, the diffuser may be a spiral horn used in an opposite sense to that of the spiral horn collector. It will be understood that such a diffuser could be connected directly to the solar collector 1 without the use of a light pipe 40.

Alternatively, a solar energy converter 50 may be provided as shown in FIG. 6. The solar energy converter comprises a cylindrical chamber having an input aperture 51 in the centre of one circular end face 52. The internal walls of the solar collector may be provided with photovoltaic cells or with thermal energy absorbing means, such as pipes containing a fluid for the absorption and conversion of solar energy incident through the input aperture 51. Solar energy entering the solar converter via the input aperture 51 may undergo multiple reflections within the chamber 50 before being absorbed. In addition, the inside of the chamber 50 may be provided with wavelength-converting means, for example to convert the wavelength of the solar energy into a wavelength more suitable for absorption by photovoltaic cells. In order to maintain the efficiency of the solar cells they may be cooled in a known manner, by, for example, a cooling fluid and the energy gained by the cooling fluid may also be utilised in a known manner.

It will be appreciated by the person skilled in the art that the shape of the chamber 50 is not critical and any convenient shape which will promote multiple reflections within the chamber 50 will be suitable. Similarly, the placement of the aperture 51 is not critical. The input aperture 51 of the solar collector may be connected directly to the exit aperture 3 of the solar collector 1 or the solar collector 1 may be connected to the solar converter 50 by means of light pipes 40.

What is claimed is:

1. A solar energy concentrator comprising a spiral horn having an axis perpendicular to a plane of the spiral, said concentrator including: an input aperture forming a mouth of the horn, an internal light-reflecting surface of the horn, and an exit aperture at an end of the horn remote from the mouth of the horn, said exit aperture being smaller than said input aperture and said horn continuously tapering both in the direction of said axis and in the plane of the spiral, between the input and output apertures, wherein the horn is adapted to concentrate, by multiple reflections from the internal light-reflecting surface of the horn, solar energy incident within a predetermined range of angles of incidence on the input aperture, such that concentrated solar energy is emitted from the exit aperture.

2. A solar energy concentrator as claimed in claim 1, wherein at least one director is provided in the mouth of the horn to reflect light incident from outside the predetermined range of angles of incidence into the predetermined range of angles of incidence.

3. A solar energy concentrator as claimed in claim 2, wherein the at least one director is a baffle disposed substantially parallel to the axis of the spiral horn.

4. A solar energy concentrator as claimed in claim 2, wherein the at least one director is a partial spiral horn disposed substantially perpendicular to the axis of the spiral horn in at least a portion of the spiral horn most proximate to the mouth of the horn.

5. A solar energy concentrator as claimed in claim 1, wherein the spiral horn has a substantially quadrilateral cross-section parallel to the axis of the horn.

6. A solar energy concentrator as claimed in claim 1, wherein the spiral is a Golden Section Spiral.

7. A solar energy concentrator as claimed in claim 1, wherein the horn is of metal.

8. A solar energy concentrator as claimed in claim 7, wherein the metal is aluminium.

9. A solar energy concentrator as claimed in claim 1, wherein the horn has portions formed of different materials disposed along the horn spiral, the materials being adapted to withstand the temperatures reached in the respective portions of the collector in use.

10. A solar energy concentrator as claimed in claim 9, wherein a portion of the horn proximate the exit aperture is of a ceramic material.

11. A solar energy concentrator as claimed in claim 1, wherein the light-reflecting surface is protected by ultraviolet radiation absorbing means.

12. A combination of the solar energy concentrator as claimed in claim 1 and distribution means in communication with the exit aperture and adapted for distributing the concentrated solar energy emitted from the exit aperture.

13. A combination as claimed in claim 12, wherein the distribution means includes at least one light pipe.

14. A combination as claimed in claim 12, wherein the distribution means includes a diffuser for diffusing at least some of the concentrated solar energy to provide illumination.

15. A combination as claimed in claim 14, wherein the diffuser is in the shape of a spiral horn.

16. A solar energy concentrator as claimed in claim 1 in combination with a solar energy conversion chamber having a chamber aperture in communication with the concentrator exit aperture, the chamber containing energy conversion means for converting concentrated solar energy emitted from the exit aperture.

17. A combination as claimed in claim 16, wherein the energy conversion means includes a photovoltaic cell.

18. A combination as claimed in claim 16, wherein the energy conversion means includes heat absorbing media.

19. A combination as claimed in claim 16, wherein the energy conversion means includes steam generating means.

20. A combination as claimed in claim 16, wherein the energy conversion means includes a solar furnace.

21. A combination as claimed in claim 16 , wherein at least some of the solar energy is reflected within the chamber before being incident on the energy conversion means.

22. A combination as claimed in claim 16, wherein at least some of the solar energy undergoes wavelength changes within the chamber.

23. A combination as claimed in claim 22, wherein solar energy increases wavelength by energy absorption and/or dissipation.

24. A combination as claimed in any of claims 16 to 23 wherein solar energy distribution means is provided to transmit solar energy from the exit aperture to the chamber aperture.

25. A combination as claimed in claim 24 wherein the distribution means includes at least one light pipe.

* * * * *